(12) United States Patent
Xu

(10) Patent No.: US 7,463,078 B2
(45) Date of Patent: Dec. 9, 2008

(54) LEVEL-SHIFTING DIFFERENTIAL AMPLIFIER

(75) Inventor: Songtao Xu, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/623,185

(22) Filed: Jan. 15, 2007

(65) Prior Publication Data

US 2008/0169875 A1    Jul. 17, 2008

(51) Int. Cl.
*H03L 5/00* (2006.01)
(52) U.S. Cl. .................. 327/333; 326/68; 326/81
(58) Field of Classification Search ........... 327/306, 327/333; 326/61–63, 68, 80–81
See application file for complete search history.

(56) References Cited

U.S. PATENT DOCUMENTS 6,396,329 B1 * 5/2002 Zerbe .................... 327/336
6,639,427 B2 * 10/2003 Dray et al. .................... 326/83

OTHER PUBLICATIONS

Cutler, Phillip, "Linear Electronic Circuits with Illustrative Problems," 1972, pp. 14-15.

* cited by examiner

*Primary Examiner*—Dinh T. Le
(74) *Attorney, Agent, or Firm*—Downs Rachlin Martin PLLC

(57) ABSTRACT

An analog level-shifting differential amplifier for providing signal amplitude and/or common mode adjustment is disclosed. In one example, a receiver system may include a first amplification stage that is powered, for example, via an I/O power supply (e.g., VDDIO) and a second amplification stage that is powered, for example, via a core logic power supply (e.g., VDD). Arranged between the first and second amplification stages may be the analog level-shifting differential amplifier. The analog level-shifting differential amplifier may include a set of variable impedance elements for controlling the output common mode and output signal swing of the level-shifting differential amplifier.

15 Claims, 3 Drawing Sheets

LEVEL-SHIFTING DIFFERENTIAL AMPLIFIER

FIELD OF THE DISCLOSURE

The present disclosure generally relates to the field of input/output circuitry in integrated circuits. In particular, the present disclosure is directed to a level-shifting buffer for providing signal amplitude and/or common mode adjustment in an integrated circuit receiver.

BACKGROUND

A typical differential analog receiver in an integrated circuit contains a first stage that is powered by a first power supply, such as a VDDIO supply. The first stage is followed by a second stage that is powered by a core power supply, such as a VDD supply. VDDIO may be, for example, be 3.3 volts, 2.5 volts, 1.8 volts, or 1.5 volts. However, as integrated circuit technology scales the core power supply voltage is decreasing. For example, the VDD supply may be about 1.0 volts. Problems arise as technology scales and the voltage difference between VDDIO and VDD increases.

When power supply variations and chip IR drop in an integrated circuit are considered, a nominal VDD supply of about 1.0 volts may be as low as 0.7 volts. The output common mode of the first stage of the differential analog receiver may be higher than the input common mode of the second stage because, in one example, the output common mode of the first stage may be higher than the VDD supply voltage. In some cases, the output common mode of the first stage falls within the input common mode range of the second stage, but in other cases it may fall outside the range and, thus, the second stage will not be able to amplify the signal from the first stage.

Additionally, the differential output of the first stage may have a very large amplitude variation as a result of both the wide VDDIO range and wide input dynamic range. This can cause a reliability problem because the second stage uses native oxide devices and the maximum voltage that the gate-oxide of the second stage may withstand may be much less than the signal levels of the first stage. In some cases, the signal levels of the first stage drive a voltage of more than the maximum voltage that is allowed across the gate-oxide of the second stage, which may cause gate-oxide damage that may cause reliability problems.

A need exists for a level-shifting buffer for providing signal amplitude and/or common mode adjustment in an integrated circuit receiver.

SUMMARY OF THE DISCLOSURE

In one embodiment, a PFET level shifting differential amplifier is provided. The amplifier includes a first power supply, a second power supply; a pair of differential inputs; a first PFET having a first gate in electrical communication with a first one of the pair of differential inputs, a first terminal in electrical communication with the first power supply, and a second terminal; a second PFET in parallel with the first PFET, the second PFET having a second gate in electrical communication with a second one of the pair of differential inputs, a third terminal in electrical communication with the first power supply, and a fourth terminal; a first adjustable impedance element electrically connected between the second terminal and the second power supply; a second adjustable impedance element in parallel with the first adjustable impedance element, the second adjustable impedance element being electrically connected between the fourth terminal and the second power supply; a first output node electrically connected between the second terminal and the first adjustable impedance element; a second output node electrically connected between the fourth terminal and the second adjustable impedance element; and a third adjustable impedance element electrically connected between the first and second output nodes, the third adjustable impedance element includes a diode connected FET or a pass gate.

In another embodiment, a PFET level shifting differential amplifier is provided. The amplifier includes a first power supply; a second power supply; a pair of differential inputs; a first PFET having a first gate in electrical communication with a first one of the pair of differential inputs, a first terminal in electrical communication with the first power supply, and a second terminal; a second PFET in parallel with the first PFET, the second PFET having a second gate in electrical communication with a second one of the pair of differential inputs, a third terminal in electrical communication with the first power supply, and a fourth terminal; a first adjustable impedance element electrically connected between the second terminal and the second power supply; a second adjustable impedance element in parallel with the first adjustable impedance element, the second adjustable impedance element being electrically connected between the fourth terminal and the second power supply, wherein the first and second adjustable impedance elements each include a first pass gate; a first output node electrically connected between the second terminal and the first adjustable impedance element; a second output node electrically connected between the fourth terminal and the second adjustable impedance element; and a third adjustable impedance element electrically connected between the first and second output nodes, the third adjustable impedance element includes a diode connected FET or a second pass gate, wherein a differential swing between the first and second output nodes is a function of a differential swing between the pair of differential inputs and an output common mode at the first and second output nodes is a function of the first power supply.

In yet another embodiment, a PFET level shifting differential amplifier is provided. The amplifier includes a first power supply; a second power supply; a pair of differential inputs; a first PFET having a first gate in electrical communication with a first one of the pair of differential inputs, a first terminal in electrical communication with the first power supply, and a second terminal; a second PFET in parallel with the first PFET, the second PFET having a second gate in electrical communication with a second one of the pair of differential inputs, a third terminal in electrical communication with the first power supply, and a fourth terminal; a first adjustable impedance element electrically connected between the second terminal and the second power supply; a second adjustable impedance element in parallel with the first adjustable impedance element, the second adjustable impedance element being electrically connected between the fourth terminal and the second power supply; a first output node electrically connected between the second terminal and the first adjustable impedance element; a second output node electrically connected between the fourth terminal and the second adjustable impedance element; a third adjustable impedance element electrically connected between the first and second output nodes, the third adjustable impedance element includes a diode connected FET or a pass gate; a differential pair of transistors of an additional amplifier circuit, the differential pair of transistors electrically connected between a third power supply and the second power supply, each of the differential pair of transistors having a gate driven by one of the first and second output nodes; and a third PFET having a third gate in electrical communication with a node between the differential pair of transistors and the second power supply, a fifth terminal in electrical communication with the first power supply, and a sixth terminal in electrical communication with the second power supply, the first and second adjustable impedance elements being driven by a node electrically connected between the first power supply and the fifth terminal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Embodiments of the present disclosure include an analog level-shifting buffer for providing signal amplitude and common mode adjustment in an integrated circuit receiver. In one example, a receiver system may include a first amplification stage that is powered, for example, via an I/O power supply (e.g., VDDIO) and a second amplification stage that is powered, for example, via a core logic power supply (e.g., VDD). Arranged between the first and second amplification stages may be the analog level-shifting buffer. In one exemplary aspect, a level-shifting buffer may ensure, via a set of variable impedance elements, that the output common mode of the analog level-shifting buffer is within the range of the input common mode of the second amplification stage and/or that the output signal amplitude of the analog level-shifting buffer is not sufficiently large to cause gate-oxide damage within the second amplification stage. The resistance of the variable impedance elements may vary as a function of a power supply voltage, such as the VDDIO voltage, and the input signal swing and, thus, the output common mode and signal amplitude may be adjusted as a function of the power supply voltage and/or the input signal swing.

Figure 1:
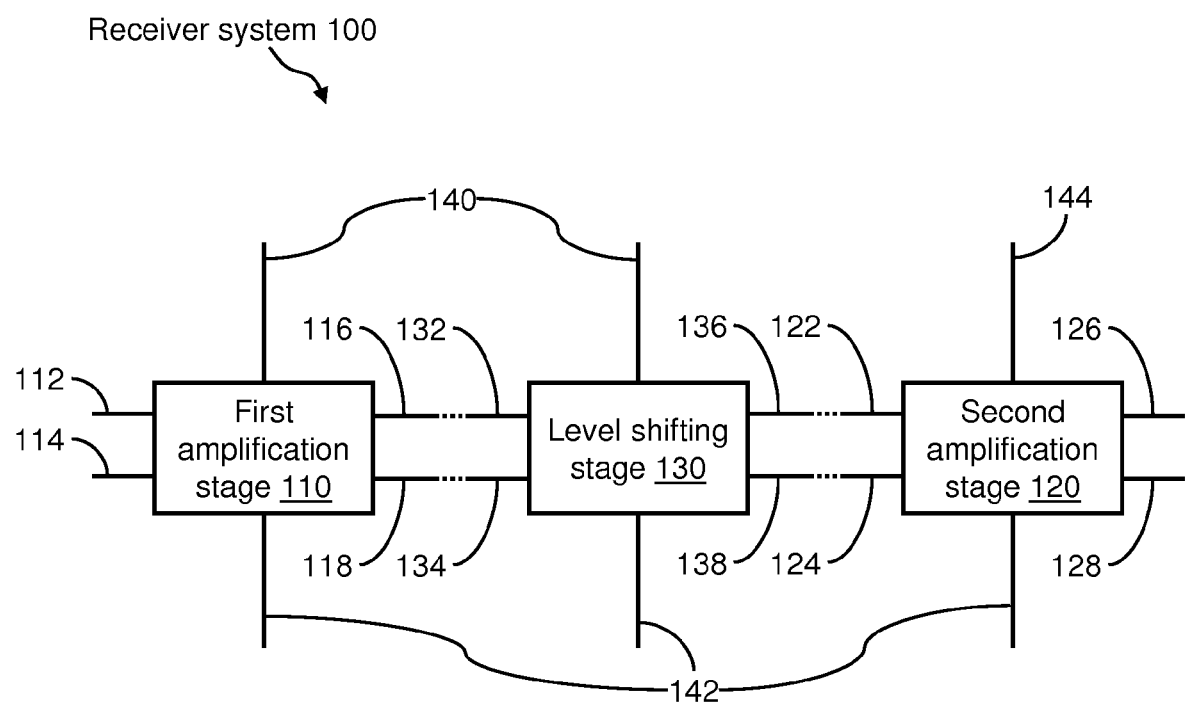
FIG. 1 illustrates a high level block diagram of an example of a receiver system that includes a level shifter circuit for providing signal amplitude and common mode adjustment in an integrated circuit receiver.

FIG. 1 illustrates a high level block diagram of a receiver system 100, which is an example of a receiver system that includes a level shifter circuit for providing signal amplitude and/or common mode adjustment in an integrated circuit receiver. Receiver system 100 may include a first amplification stage 110 that is fed by differential input signals 112 and 114 and provides differential output signals 116 and 118. First amplification stage 110 may be the input/output (I/O) interface of an integrated circuit (IC) for receiving a differential signal pair from outside of the IC chip. First amplification stage 110 may be electrically connected between a first power rail 140 and a second power rail 142. In one example, first power rail 140 may be a dedicated power supply, such as a dedicated power supply for input/output circuits (e.g., VDDIO). In another example, first power rail 140 may have a voltage range of about 1.5 volts to about 3.3 volts. In yet another example, second power rail 142 may be a ground rail (e.g., about 0 volts) of an integrated circuit.

Additionally, receiver system 100 may include a second amplification stage 120 that is fed by differential input signals 122 and 124 and provides differential output signals 126 and 128. Second amplification stage 120 may be the stage of the IC receiver system that passes the I/O signal to the core logic of the IC chip. Second amplification stage 120 may be electrically connected between a third power rail 144 and second power rail 142. In one example, third power rail 144 may be a dedicated power supply (e.g., VDD or VCC) for the core logic of an integrated circuit that may have a voltage range of, for example, but not limited to, about 0.9 volts to about 1.1 volts.

Additionally, receiver system 100 may include a level shifting stage 130 that is fed by differential input signals 132 and 134 and provides differential output signals 136 and 138. Level shifting stage 120 may be electrically connected between first power rail 140 and second power rail 142. Level shifting stage 130 may be a buffer stage that is provided between first amplification stage 110 and second amplification stage 120 of an integrated circuit receiver for receiving an input from first amplification stage 110 that has a certain signal amplitude and common mode and providing an output of another certain signal amplitude and common mode that is compatible with second amplification stage 120. In one example, the common mode of differential output signals 136 and 138 of level shifting stage 130 may be within the range of the input common mode of second amplification stage 120 and the signal amplitude is not sufficiently large to cause gate-oxide damage within second amplification stage 120.

The shift in amplitude and common mode within level shifting stage 130 may be a function of the voltage level of first power rail 140. In particular, when the voltage level of first power rail 140 varies, level shifting stage 130 may minimize the variation of the output common mode voltage such that it is maintained always within the input common mode range of second amplification stage 120. Additionally, level shifting stage 130 may amplify or attenuate the signal amplitude of first amplification stage 110. In such and example, when the output signal amplitude of first amplification stage 110 is large, no amplification or attenuation may be provided. By contrast, when the output signal amplitude of first amplification stage 110 is small, amplification may be provided.

In one example, first power rail 140 may be about 2.5 volts, second power rail 142 may be about 0 volts (ground), third power rail 144 may be about 1 volts, the amplitude of output signals 116 and 118 of first amplification stage 110 may be about 1 volts, the output common mode of first amplification stage 110 may be about 1.25 volts, the amplitude of output signals 136 and 138 of level shifting stage 130 may be about 0.5 volts, and the output common mode of level shifting stage 130 may be about 0.5 volts, in order to be compatible with the input signal amplitude and the input common mode of second amplification stage 120.

Figure 2:
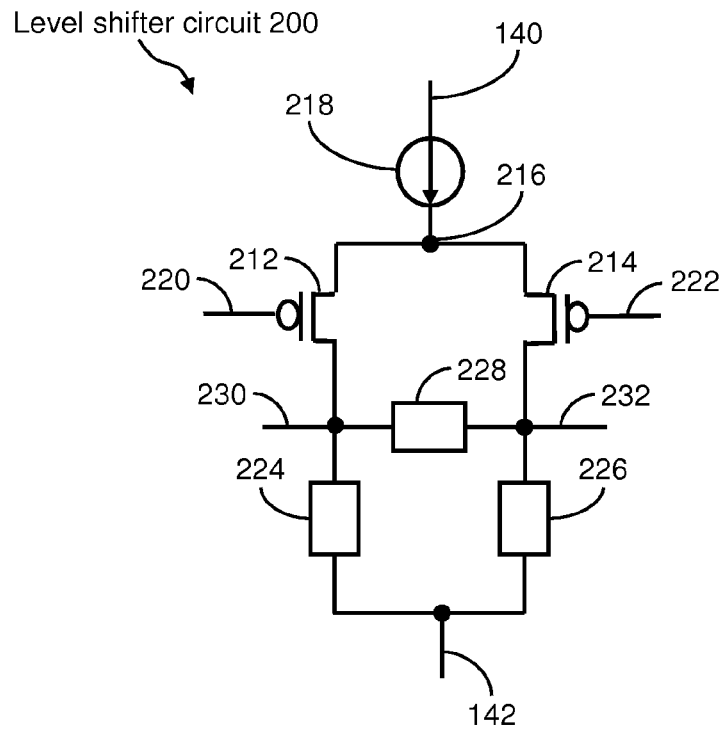
FIG. 2 illustrates a schematic diagram of an example of a level shifter circuit for providing signal amplitude and common mode adjustment in an integrated circuit receiver.

FIG. 2 illustrates a schematic diagram of one embodiment of a level shifter circuit 200. Level shifter circuit 200 may be an level-shifting buffer that is connected between first power rail 140 and second power rail 142. In particular, level shifter circuit 200 may include a pair of p-type field-effect transistors (PFETS) 212 and 214 whose sources are connected at a node 216. Optionally connected between node 216 and first power rail 140 may be a constant current source element 218, which may be an ideal constant current source. Constant current source element 218 may regulate (i.e., limit) the circuit of level shifter circuit 200 to a certain constant current flow, regardless of variations in first power rail 140 and second power rail 142. In one example, constant current source element 218 may be a FET device that is controlled to provide a constant current.

The gate of transistor 212 may be in electrical communication with an input signal node 220, which may be the first of two differential input signals, and the gate of transistor 214 may be in electrical communication with an input signal node 222, which may be the second of two differential input signals of level shifter circuit 200. A first impedance element 224 may be connected between a first terminal (e.g., a drain) of transistor 212 and second power rail 142. A second impedance element 226 may be connected between a first terminal (e.g., a drain) of transistor 214 and second power rail 142. An output signal node 230 is electrically positioned between transistor 212 and impedance element 224. An output signal node 232 is electrically positioned between transistor 214 and impedance element 226. Output signal nodes 230, 232 may be differential output nodes. A third impedance element 228 may be connected between output signal node 230 and output signal node 232.

First impedance element 224, second impedance element 226, and third impedance element 228 may be variable resistance elements. In one example, the resistance of first impedance element 224, second impedance element 226, and third impedance element 228 may be inversely proportional to the voltage value at first power rail 140, i.e., as the voltage value at first power rail 140 increases the resistance of first impedance element 224, second impedance element 226, and third impedance element 228 decreases. Example impedance elements may include, but are not limited to, a n-type field-effect transistor (NFET) device, a PFET device, a diode-connected FET device, and any combinations thereof. More details of example impedance elements are found with reference to FIGS. 3, 4, and 5.

In operation, differential input signals of a certain signal amplitude and input common mode are provided at input signal nodes 220 and 222. However, the signal amplitude at output signal nodes 230 and 232 may be a fraction or multiple of the amplitude of input signal nodes 220 and 222 depending on the resistance value of third impedance element 228, which varies as a function of, for example, first power rail 140. Also when the input swing is large, the impedance of third impedance element 228 is smaller and, thus, level shifter circuit 200 provides less amplification to a large input swing. As a result, the output swing of level shifter circuit 200 tends not to depend on the input swing. In one example, as the voltage value at first power rail 140 increases the resistance of third impedance element 228 decreases and, thus, the amplitude of output signal nodes 230 and 232 tends to decrease because the voltage drop across third impedance element 228 decreases and, thus, the overall variation of the output swing with respect to variations in first power rail 140 is small. Additionally, the output common mode at output signal nodes 230 and 232 depends on the resistance value of first impedance element 224 and second impedance element 226, which varies as a function of, for example, first power rail 140. In one example, as the voltage value at first power rail 140 increases the resistance of first impedance element 224 and second impedance element 226 decreases and, thus, the signals at output signal nodes 230 and 232 are pulled closer to the voltage at, for example, second power rail 142 (e.g., ground) because the voltage drop across first impedance element 224 and second impedance element 226 decreases. In one example, the resistance of first impedance element 224 and second impedance element 226 determines the output common node at output signal nodes 230 and 232. As a result of the action of level shifter circuit 200, the signal amplitude and input common mode at input signal nodes 220 and 222 may be shifted as a function of, for example, the value of first power rail 140, which causes a change (e.g., inversely proportional change) in the resistance of first impedance element 224, second impedance element 226, and third impedance element 228. In such an example, the signal amplitude and/or common mode at output signal nodes 230 and 232 may be adjusted as compared with the signal amplitude and common mode at input signal nodes 220 and 222. In another example, level shifter circuit 200 may provide signal amplitude and/or common mode translation between, for example, first amplification stage 110 and second amplification stage 120 of FIG. 1, in order to ensure that the common mode of output signal nodes 230 and 232 is within the range of the input common mode of second amplification stage 120 and that the signal amplitude is not sufficiently large to cause gate-oxide damage within second amplification stage 120.

Figure 3:
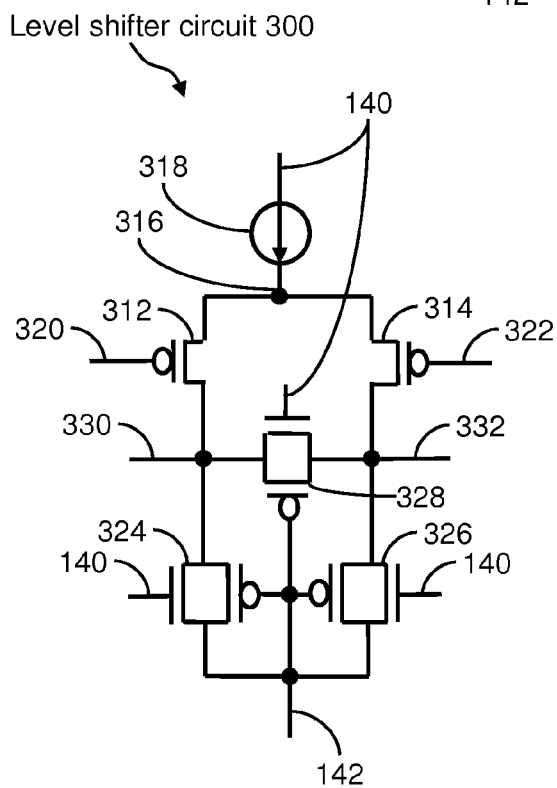
FIG. 3 illustrates a schematic diagram of another example of a level shifter circuit for providing signal amplitude and common mode adjustment in an integrated circuit receiver.

FIG. 3 illustrates a schematic diagram of another embodiment of a level shifter circuit 300. FIG. 3 shows an example embodiment of the impedance elements within a level shifter circuit, such as level shifter circuit 300. In particular, level shifter circuit 300 may include a first impedance element 324, a second impedance element 326, and a third impedance element 328 that are each formed by a pair of parallel-connected transistors. In one example, each is formed by an NFET device and a PFET device that are electrically connected in parallel as shown in FIG. 3. The gate of each NFET device may be electrically connected to first power rail 140 and the gate of each PFET device may be electrically connected to second power rail 142 (e.g., ground). The resistance of each parallel-connected transistor may vary inversely proportional to the voltage value at first power rail 140. The impedance of the PFETs of first impedance element 324 and second impedance element 326 may be determined by the voltage of nodes 330 and 332 minus the voltage of second power rail 142. In such an example, when the output common mode is high that means the voltage of nodes 330 and 332 is high, which leads to smaller resistance of the PFETs of first impedance element 324 and second impedance element 326 and, thus, the voltage of nodes 330 and 332 is dragged down (i.e., toward the voltage of second power rail 142). The PFETs of first impedance element 324 and second impedance element 326 try to prevent the output common mode from going high. The impedance of the PFET of third impedance element 328 may be determined by the voltage of nodes 330 and 332 minus the voltage of second power rail 142. When output swing is larger, the maximum voltage of nodes 330 and 332 is large which leads to smaller resistance of the PFET of third impedance element 328, which brings down the output swing. The PFET of third impedance element 328 may prevent the output swing from going high. Additionally, because the gates of each NFET device of first impedance element 324, second impedance element 326, and third impedance element 328 are connected to first power rail 140, which may vary, the strength at which each NFET device is turned on may vary and, thus, the resistance of each NFET device may vary inversely proportional to the voltage value at first power rail 140. In one example, first impedance element 324, second impedance element 326, and third impedance element 328 may be variable resistance impedance elements for adjusting the signal amplitude and/or common mode at output signal nodes 330 and 332 as compared with the signal amplitude and common mode at input signal nodes 320 and 322. The NFET of third impedance element 328 may have a characteristic that is similar to the PFET of third impedance element 328. More specifically, the impedance of the NFET of third impedance element 328 may be determined by the difference between first power rail 140 and the minimum voltage of nodes 330 and 332. Therefore, when the output swing is larger, the minimum voltage of nodes 330 and 332 is smaller, and the impedance of the NFET of third impedance element 328 is small. This may prevent the output swing from going high. In such an example, level shifter circuit 300 may provide signal amplitude and/or common mode translation between, for example, first amplification stage 110 and second amplification stage 120 of FIG. 1, in order to ensure that the common mode of output signal nodes 330 and 332 is within the range of the input common mode of second amplification stage 120 and/or that the signal amplitude is not sufficiently large to cause gate-oxide damage within second amplification stage 120.

Figure 4:
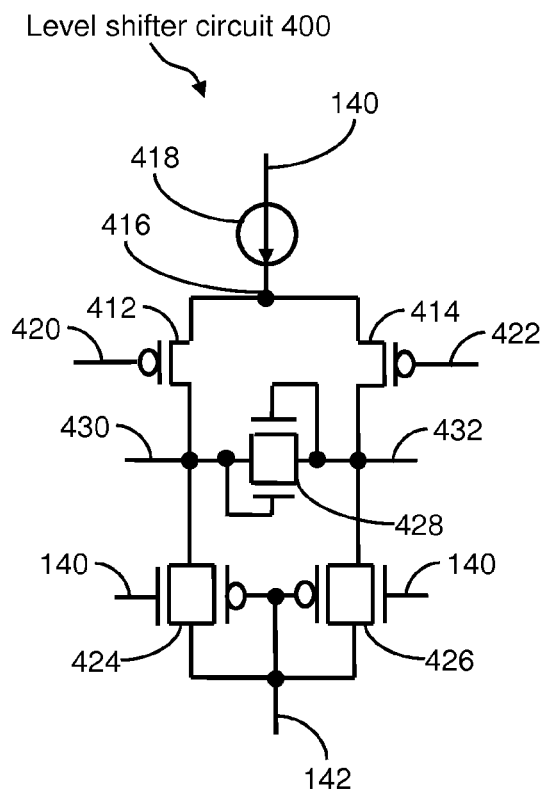
FIG. 4 illustrates a schematic diagram of yet another example of a level shifter circuit for providing signal amplitude and common mode adjustment in an integrated circuit receiver.

FIG. 4 illustrates a schematic diagram of yet another embodiment of a level shifter circuit 400. FIG. 4 shows an example embodiment of the impedance elements within a level shifter circuit, such as level shifter circuit 400. In particular, level shifter circuit 400 may include a first impedance element 424, a second impedance element 426, and a third impedance element 428. In one example, first impedance element 424 and second impedance element 426 may each be formed by a pair of parallel-connected transistors as shown in FIG. 4 and may be substantially identical in form and function to first impedance element 324 and second impedance element 326 of level shifter circuit 300, as described in FIG. 3. However, level shifter circuit 400 of FIG. 4 shows that the third impedance element, such as third impedance element 428, may be formed of a pair of diode-connected transistors, such as a pair of diode-connected NFET devices. The diode-connected transistors of third impedance element 428 are always turned on, but the higher the voltage swing at output signal nodes 430 and 432, the more strongly the diode-connected transistors are turned on and, thus, the more the resistance of third impedance element 428 decreases, which minimizes the variation of the output swing with respect to input swing.

In one example, first impedance element 424, second impedance element 426, and the diode-connected transistor arrangement of third impedance element 428, each may be a variable resistance impedance element for adjusting the signal amplitude and/or common mode at output signal nodes 430 and 432 as compared with the signal amplitude and common mode at input signal nodes 420 and 422. In such an example, level shifter circuit 400 may provide signal amplitude and/or common mode translation between first amplification stage 110 and second amplification stage 120 of FIG. 1, in order to ensure that the common mode of output signal nodes 430 and 432 is within the range of the input common mode of second amplification stage 120 and/or that the signal amplitude is not sufficiently large to cause gate-oxide damage within second amplification stage 120.

Figure 5:
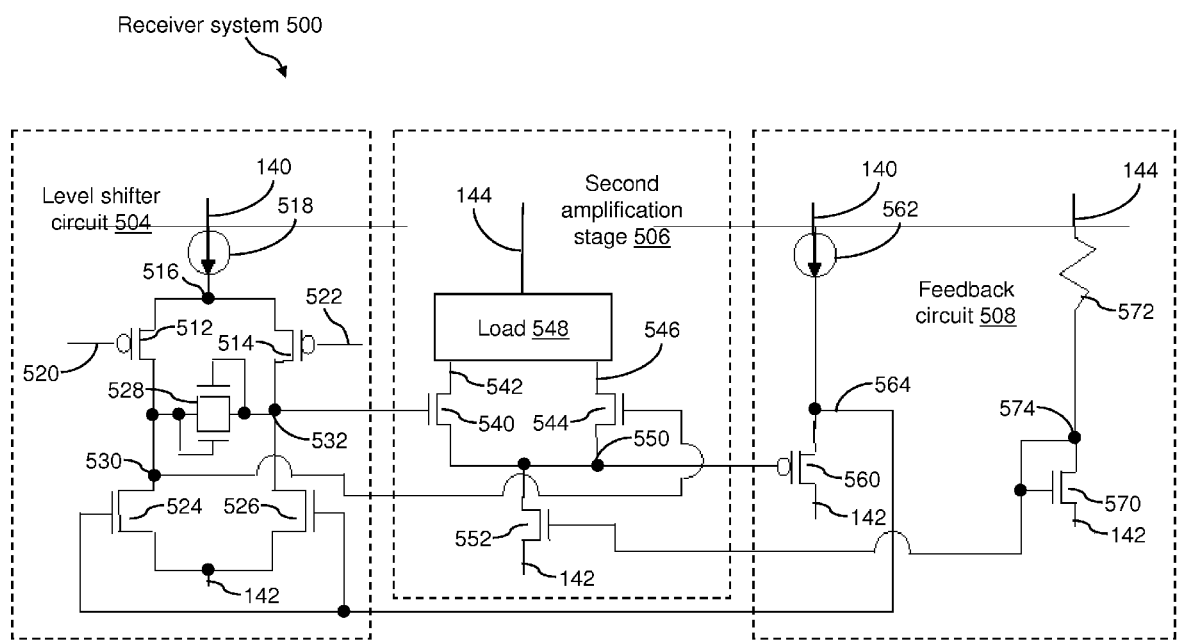
FIG. 5 illustrates a schematic diagram of another example of a receiver system that includes yet another example of a level shifter circuit for providing signal amplitude and common mode adjustment in an integrated circuit receiver.

FIG. 5 illustrates a schematic diagram of a receiver system 500, which is another example of a receiver system that includes a level shifter circuit for providing signal amplitude and common mode adjustment in an integrated circuit receiver. Receiver system 500 may include a level shifter circuit 504, which may be another example embodiment of level shifting stage 130 of FIG. 1, that may be arranged between first power rail 140 and second power rail 142 (e.g., ground). Additionally, receiver system 500 may include a second amplification stage 506, which may be an example embodiment of second amplification stage 120 of FIG. 1, that may be arranged between third power rail 144 and second power rail 142 (e.g., ground). Additionally, receiver system 500 may include a feedback circuit 508, which is a negative feedback loop for providing fine control of the variable resistances of the first, second, and third impedance elements of level shifter circuit 504. Feedback circuit 508 may be connected to first power rail 140, third power rail 144, and second power rail 142 (e.g., ground).

Level shifter circuit 504 may include a first, second, and third impedance element, such as described in FIGS. 2, 3, and 4. In one example, level shifter circuit 504 may include a first impedance element 524 and a second impedance element 526 that may be formed of an NFET device and a third impedance element 528 that may be formed of a pair of diode-connected transistors, such as described with reference to third impedance element 428 of FIG. 4. Input signal nodes 520 and 522 may be driven, for example, by differential signals of first amplification stage 110 of FIG. 1. The signal amplitude and common mode at output signal nodes 530 and 532 are adjusted as compared with the signal amplitude and common mode at input signal nodes 520 and 522. Output signal nodes 530 and 532 drive the gates of a pair of transistors 540 and 544, respectively, of second amplification stage 506. In another example, a load 548 may be connected between signal output nodes 542 and 546, respectively, and a third power rail 144. An opposite side of transistors 540 and 544 is connected to a voltage node 550. A transistor 552, which may be a constant current source element, may be connected between voltage node 550 and second power rail 142 (e.g., ground).

Voltage node 550 of second amplification stage 506 may be connected to the gate of a transistor 560 of feedback circuit 508. In one example, transistor 560 may include a PFET. Transistor 560 is electrically connected between first power supply 140 and second power supply 142. In an optional arrangement, a constant current source element 562 may be connected between first power rail 140 and second power rail 142 (e.g., ground). A voltage node 564 between transistor 560 and first power supply 140 drives adjustable impedance elements 524 and 526 (e.g., by electrical connection with the gates of transistors 524 and 526. In one example, the common mode of level shifter circuit 504 may be adjusted as a function of first power rail 140. In another example, when first power rail 140 is increased, the feedback loop pulls down the common mode of output signal nodes 530 and 532.

The common mode may be optimized with regard to third power rail 144 and the current through optional transistor 552. More specifically, feedback circuit 508 optionally includes a mechanism for providing a common mode adjustment that is a function of third power rail 144. In particular, feedback circuit 508 may include a diode-connected transistor 570 between third power rail 144 and second power rail 142 (e.g., ground), as shown in FIG. 5. Optionally, circuit 500 may include a resistor 522. A voltage node 574 at diode-connected transistor 570 may be connected to the gate of transistor 552 of second amplification stage 506. In one example, diode-connected transistor 570 may provide dependence on third power rail 144 to the common mode of output signal nodes 530 and 532 of level shifter circuit 504. In such an example, when third power rail 144 increases the current through transistor 552 may increase (and voltage node 550 may decrease), which may result in larger common mode of output signal nodes 530 and 532 of level shifter circuit 504 and transistors 540 and 544 have sufficient overdrive voltage.

In another example, receiver system 500 may provide a common mode that tracks to third power rail 144 and counter tracks to first power rail 140. In such an example, it may be ensured that the voltage at output signal nodes 530 and 532 of level shifter circuit 504 may not be sufficiently large to damage transistors 540 and 544 of second amplification stage 506.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A PFET level shifting differential amplifier comprising:
   a first power supply;
   a second power supply;
   a pair of differential inputs;
   a first PFET having a first gate in electrical communication with a first one of said pair of differential inputs, a first terminal in electrical communication with said first power supply, and a second terminal;
   a second PFET in parallel with said first PFET, said second PFET having a second gate in electrical communication with a second one of said pair of differential inputs, a third terminal in electrical communication with said first power supply, and a fourth terminal;
   a first adjustable impedance element electrically connected between said second terminal and said second power supply;
   a second adjustable impedance element in parallel with said first adjustable impedance element, said second adjustable impedance element being electrically connected between said fourth terminal and said second power supply wherein said first and second impedance elements each include a pass gate including a PFET with a third gate in electrical communication with said second power supply and an NFET with a fourth gate in electrical communication with said first power supply;
   a first output node electrically connected between said second terminal and said first adjustable impedance element;
   a second output node electrically connected between said fourth terminal and said second adjustable impedance element; and
   a third adjustable impedance element electrically connected between said first and second output nodes, said third adjustable impedance element includes a first diode connected FET or a pass gate.

2. A PFET level shifting differential amplifier according to claim 1, further comprising:
   a differential pair of transistors of an additional amplifier circuit, said differential pair of transistors electrically connected between a third power supply and said second power supply, each of said differential pair of transistors having a gate driven by one of said first and second output nodes; and
   a third PFET having a third gate in electrical communication with a node between said differential pair of transistors and said second power supply, a fifth terminal in electrical communication with said first power supply, and a sixth terminal in electrical communication with said second power supply, said first and second adjustable impedance elements being driven by a node electrically connected between said first power supply and said fifth terminal.

3. A PFET level shifting differential amplifier according to claim 2, further comprising a second diode connected FET having a seventh terminal in electrical communication with said third power supply, an eighth terminal in electrical communication with said second power supply, and a fourth gate in electrical communication with a fourth gate of a transistor electrically connected between said differential pair of transistors and said second power supply.

4. A PFET level shifting differential amplifier according to claim 1, wherein a differential swing between said first and second output nodes is a function of a differential swing between said pair of differential inputs.

5. A PFET level shifting differential amplifier according to claim 1, wherein an output common mode at said first and second output nodes is a function of said first power supply and/or an input common mode at said pair of differential inputs.

6. A PFET level shifting differential amplifier according to claim 1, wherein said first power supply is an input/output power supply and said second power supply is ground.

7. A PFET level shifting differential amplifier according to claim 1, wherein said third adjustable impedance element includes said first diode connected FET.

8. A PFET level shifting differential amplifier according to claim 1, wherein said third adjustable impedance element includes the pass gate having a PFET with a fifth gate in electrical communication with said second power supply and an NFET with a sixth gate in electrical communication with said first power supply.

9. A PFET level shifting differential amplifier comprising:
   a first power supply;
   a second power supply;
   a pair of differential inputs;
   a first PFET having a first gate in electrical communication with a first one of said pair of differential inputs, a first terminal in electrical communication with said first power supply, and a second terminal;
   a second PFET in parallel with said first PFET, said second PFET having a second gate in electrical communication with a second one of said pair of differential inputs, a third terminal in electrical communication with said first power supply, and a fourth terminal;
   a first adjustable impedance element electrically connected between said second terminal and said second power supply;
   a second adjustable impedance element in parallel with said first adjustable impedance element, said second adjustable impedance element being electrically connected between said fourth terminal and said second power supply, wherein said first and second adjustable impedance elements each include a first pass gate including a PFET with a third gate in electrical communication with said second power supply and an NFET with a fourth gate in electrical communication with said first power supply;
   a first output node electrically connected between said second terminal and said first adjustable impedance element;
   a second output node electrically connected between said fourth terminal and said second adjustable impedance element; and
   a third adjustable impedance element electrically connected between said first and second output nodes, said third adjustable impedance element includes a diode connected FET or a second pass gate, wherein a differential swing between said first and second output nodes is a function of a differential swing between said pair of differential inputs and an output common mode at said first and second output nodes is a function of said first power supply.

10. A PFET level shifting differential amplifier according to claim 9, wherein said third adjustable impedance element includes a diode connected FET.

11. A PFET level shifting differential amplifier according to claim 9, wherein said third adjustable impedance element includes a second pass gate with a PFET having a fifth gate in electrical communication with said second power supply and an NFET with a sixth gate in electrical communication with said first power supply.

12. A PFET level shifting differential amplifier comprising:
- a first power supply;
- a second power supply;
- a pair of differential inputs;
- a first PFET having a first gate in electrical communication with a first one of said pair of differential inputs, a first terminal in electrical communication with said first power supply, and a second terminal;
- a second PFET in parallel with said first PFET, said second PFET having a second gate in electrical communication with a second one of said pair of differential inputs, a third terminal in electrical communication with said first power supply, and a fourth terminal;
- a first adjustable impedance element electrically connected between said second terminal and said second power supply;
- a second adjustable impedance element in parallel with said first adjustable impedance element, said second adjustable impedance element being electrically connected between said fourth terminal and said second power supply;
- a first output node electrically connected between said second terminal and said first adjustable impedance element;
- a second output node electrically connected between said fourth terminal and said second adjustable impedance element;
- a third adjustable impedance element electrically connected between said first and second output nodes, said third adjustable impedance element includes a first diode connected FET or a pass gate;
- a differential pair of transistors of an additional amplifier circuit, said differential pair of transistors electrically connected between a third power supply and said second power supply, each of said differential pair of transistors having a gate driven by one of said first and second output nodes; and
- a third PFET having a third gate in electrical communication with a node between said differential pair of transistors and said second power supply, a fifth terminal in electrical communication with said first power supply, and a sixth terminal in electrical communication with said second power supply, said first and second adjustable impedance elements being driven by a node electrically connected between said first power supply and said fifth terminal.

13. A PFET level shifting differential amplifier according to claim 12, further comprising a second diode connected FET having a seventh terminal in electrical communication with said third power supply, an eighth terminal in electrical communication with said second power supply, and a fourth gate in electrical communication with a fourth gate of a transistor electrically connected between said differential pair of transistors and said second power supply.

14. A PFET level shifting differential amplifier according to claim 12, wherein said third adjustable impedance element includes said first diode connected FET.

15. A PFET level shifting differential amplifier according to claim 12, wherein said third adjustable impedance element includes the pass gate with a PFET having a gate in electrical communication with said second power supply and an NFET with a gate in electrical communication with said first power supply.

* * * * *